United States Patent
Yang et al.

(10) Patent No.: US 11,665,449 B2
(45) Date of Patent: May 30, 2023

(54) IMAGE SENSOR WITH DELAY LINE CHARGE PUMP VOLTAGE GENERATOR

(71) Applicant: SHENZHEN GOODIX TECHNOLOGY CO., LTD., Shenzhen (CN)

(72) Inventors: Chao Yang, San Diego, CA (US); Dazhi Wei, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 299 days.

(21) Appl. No.: 17/081,914

(22) Filed: Oct. 27, 2020

(65) Prior Publication Data

US 2022/0132069 A1  Apr. 28, 2022

(51) Int. Cl.
*H03K 5/15* (2006.01)
*H04N 25/71* (2023.01)
*H04N 25/709* (2023.01)

(52) U.S. Cl.
CPC ......... *H04N 25/745* (2023.01); *H03K 5/1508* (2013.01); *H04N 25/709* (2023.01); *H04N 25/71* (2023.01)

(58) Field of Classification Search
CPC .... H03B 5/24; G06F 1/04; H03L 1/02; H04N 5/372; H04N 5/3698; H04N 5/3765; H04N 5/369; H03K 5/1508; H05G 1/38
USPC ....................................................... 348/294
See application file for complete search history.

(56) References Cited

U.S. PATENT DOCUMENTS

| | | | |
|---|---|---|---|
| 10,263,627 B1 | 4/2019 | Jain et al. | |
| 2004/0081446 A1* | 4/2004 | Compton | H04N 5/353 348/E5.037 |
| 2011/0194003 A1* | 8/2011 | Saito | H04N 5/335 348/294 |

OTHER PUBLICATIONS

State Intellectual Property Office of the People's Republic of China, first office Action issued in Application No. 202111224606.X, dated Mar. 25, 2023, 8 pages.

* cited by examiner

*Primary Examiner* — Xi Wang
(74) *Attorney, Agent, or Firm* — Kilpatrick Townsend & Stockton LLP

(57) ABSTRACT

An image sensor includes image sensor cells generating an image signal in response to one or more control signals, and a first driver generating a first control signal. The first driver includes a first positive supply terminal connected to a first power supply node. The image sensor also includes a voltage generator generating a first voltage at the first power supply node, where the voltage generator includes charge pump cells to receive clock signals and to source charge to the first power supply node, a delay line including delay line elements generating clock signals, where a first charge pump cell receives a first clock signal generated by a first delay line element, where a second charge pump cell receives a second clock signal generated by a second delay line element, and where a delay between the first clock signal and the second clock signal is determined by the delay line.

18 Claims, 4 Drawing Sheets

IMAGE SENSOR WITH DELAY LINE CHARGE PUMP VOLTAGE GENERATOR

CROSS-REFERENCE TO RELATED APPLICATIONS

This application is related to U.S. patent application Ser. No. 17/081,927, entitled "IMAGE SENSOR WITH CHARGE PUMP CELL QUANTITY CONTROL," filed Oct. 27, 2020, and which is incorporated herein by reference for all purposes.

TECHNICAL FIELD

The subject matter described herein relates to charge pump voltage generators, and more particularly to charge pump voltage generators with a delay line for image sensors.

BACKGROUND

Image sensor performance is affected by supply noise, for example, in circuits used to read image data from image cells. Circuit techniques for managing and reducing supply noise is needed in the art.

SUMMARY

One inventive aspect is an image sensor. The image sensor includes a plurality of image sensor cells, each configured to generate an image signal in response to one or more control signals, and a first driver configured to generate a first control signal, where the first driver includes a first positive supply terminal connected to a first power supply node. The image sensor also includes a voltage generator configured to generate a first voltage at the first power supply node, where the voltage generator includes a plurality of charge pump cells, each configured to receive one of a plurality of clock signals and to source charge to the first power supply node in response to the received one clock signal, a delay line including a plurality of delay line elements configured to generate the plurality of clock signals, where a first charge pump cell receives a first clock signal generated by a first delay line element, where a second charge pump cell receives a second clock signal generated by a second delay line element, and where a delay between the first clock signal and the second clock signal is determined by the delay line.

In some embodiments, the second clock signal is generated in response to the first clock signal.

In some embodiments, the first clock signal is generated in response to a received clock signal.

In some embodiments, each of the delay line elements has a non-programmable delay.

In some embodiments, the delay line includes N delay line elements, and the delay between the first clock signal and the second clock signal times N is less than or equal to one period of the received clock signal.

In some embodiments, the delay line includes N delay line elements, where the delay between the first clock signal and the second clock signal times N is less than or equal to one half period of the received clock signal.

In some embodiments, the image sensor also includes a second driver configured to generate a second control signal, where the second driver includes a second positive supply terminal connected to a second power supply node, and the voltage generator is further configured to generate a second voltage at the second power supply node, and further includes a first voltage regulator circuit configured to receive a first amount of charge from the charge pump cells, and to provide the received first amount of charge to the first power supply node at the first voltage, and a second voltage regulator circuit configured to receive a second amount of charge from the charge pump cells, and to provide the received second amount of charge to the second power supply node at a second voltage.

In some embodiments, the first and second voltages are different.

In some embodiments, the delay between the first clock signal and the second clock signal is controlled by a delay control circuit.

In some embodiments, each of the delay line elements has a programmable delay, and the delay control circuit is configured to control the programmable delay of the delay line elements.

Another inventive aspect is a method of using an image sensor. The method includes, with each of a plurality of image sensor cells, generating an image signal in response to one or more control signals, and, with a first driver, generating a first control signal, where the first driver includes a first positive supply terminal connected to a first power supply node. The method also includes, and, with a voltage generator, generating a first voltage at the first power supply node, where the voltage generator includes a plurality of charge pump cells, each configured to receive one of a plurality of clock signals and to source charge to the first power supply node in response to the received one clock signal, a delay line including a plurality of delay line elements configured to generate the plurality of clock signals, where a first charge pump cell receives a first clock signal generated by a first delay line element, where a second charge pump cell receives a second clock signal generated by a second delay line element, and where a delay between the first clock signal and the second clock signal is determined by the delay line.

In some embodiments, the second clock signal is generated in response to the first clock signal.

In some embodiments, the first clock signal is generated in response to an edge of a received clock signal.

In some embodiments, each of the delay line elements has a non-programmable delay.

In some embodiments, the delay line includes N delay line elements, where the delay between the first clock signal and the second clock signal times N is less than or equal to one period of the received clock signal.

In some embodiments, the delay line includes N delay line elements, where the delay between the first clock signal and the second clock signal times N is less than or equal to one half period of the received clock signal.

In some embodiments, the method also includes, with a second driver, generating a second control signal, where the second driver includes a second positive supply terminal connected to a second power supply node, and with the voltage generator, generating a second voltage at the second power supply node, where the voltage generator further includes a first voltage regulator circuit configured to receive a first amount of charge from the charge pump cells, and to provide the received first amount of charge to the first power supply node at the first voltage, and a second voltage regulator circuit configured to receive a second amount of charge from the charge pump cells, and to provide the received second amount of charge to the second power supply node at a second voltage.

In some embodiments, the first and second voltages are different.

In some embodiments, the delay between the first clock signal and the second clock signal is controlled by a delay control circuit.

In some embodiments, each of the delay line elements has a programmable delay, and the delay control circuit is configured to control the programmable delay of the delay line elements.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
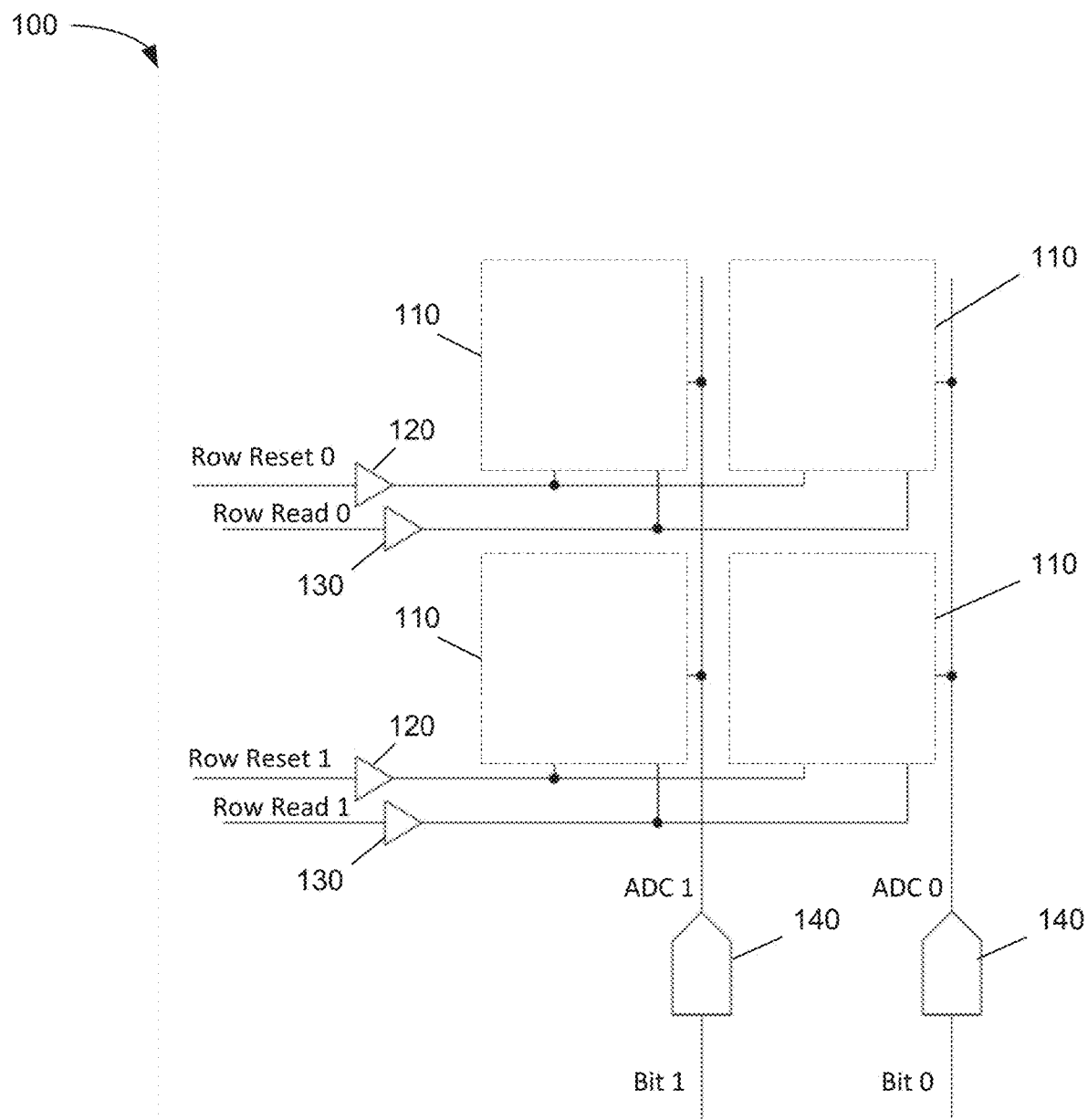
FIG. 1 is a schematic diagram of an embodiment of an image sensor array.
Figure 2:
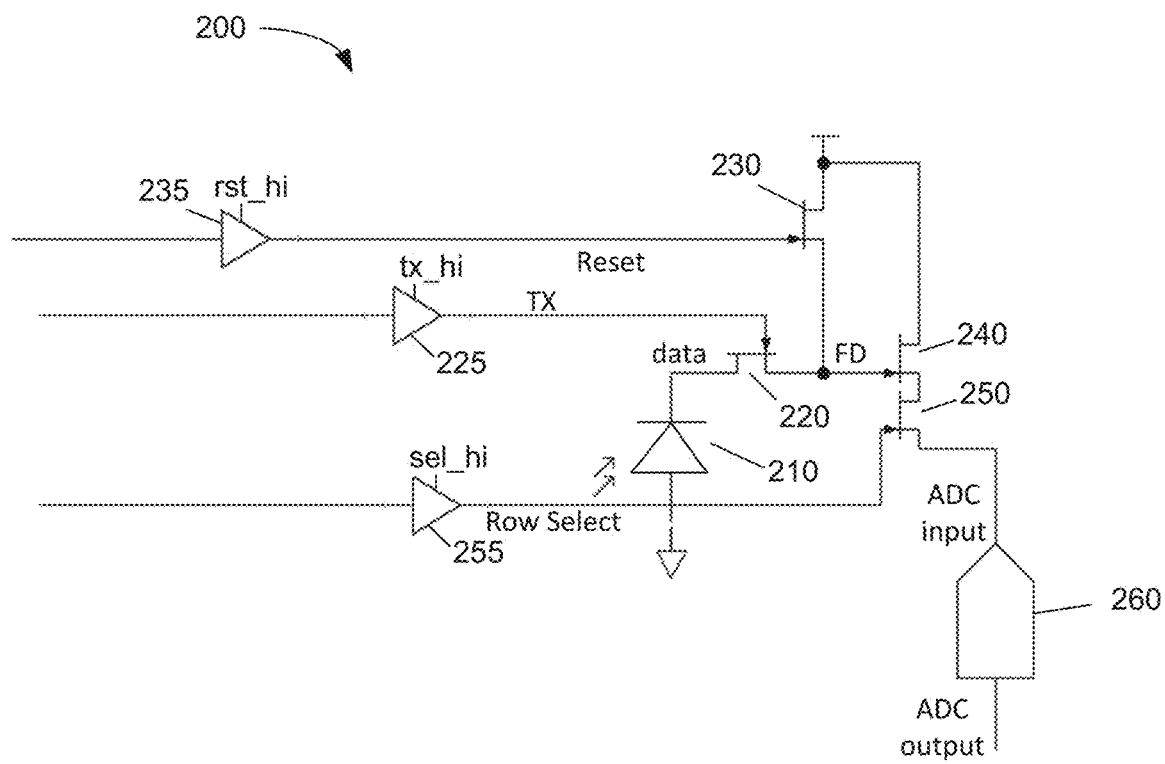
FIG. 2 is a schematic diagram of an embodiment of an image sensor array cell connected to peripheral circuitry.
Figure 3:
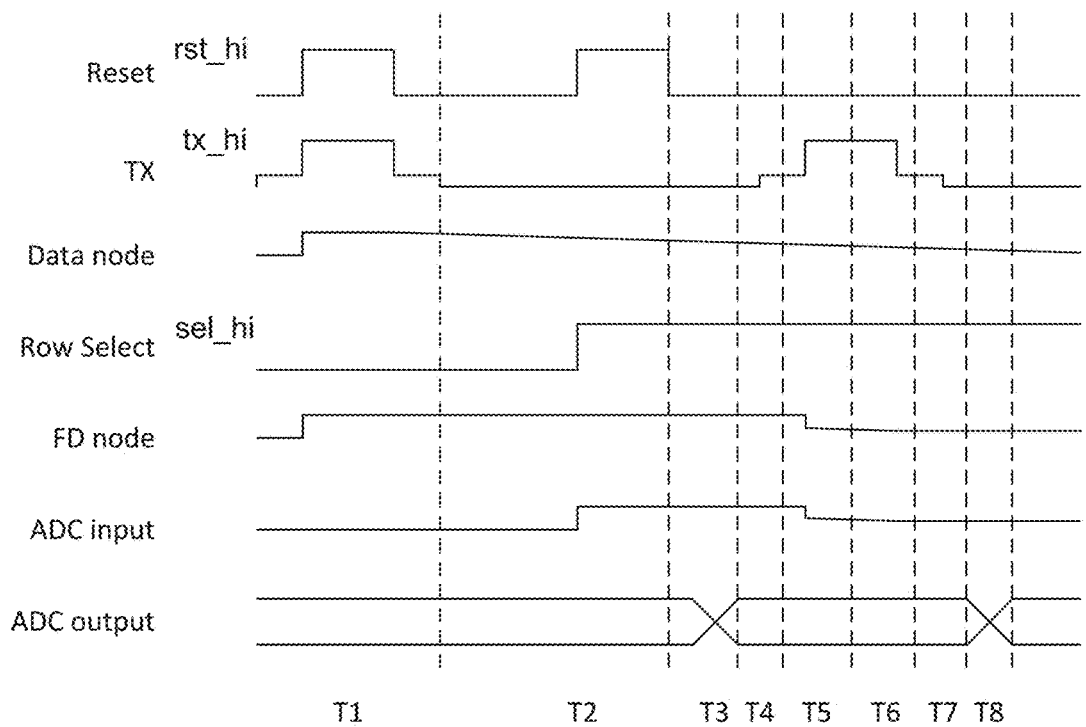
FIG. 3 is a timing diagram illustrating functionality of the image sensor array cell of FIG. 2.

Circuit features of image sensor circuits having power supplies voltage generators using charge pumps with delay lines to generate power supply voltages having minimal noise are discussed with reference to the figures. FIG. 1 is a schematic diagram of an embodiment of an image sensor array. FIGS. 2-3 illustrate a sensor array cell and its operation. FIGS. 4-7 illustrate charge pump power supply generation systems having delay lines to generate low ripple noise.

FIG. 1 is a schematic diagram of an embodiment of an image sensor array 100. Image sensor array 100 includes four image sensor cells 110, row reset buffers 120, row read buffers 130, and ADCs 140. Image sensor array 100 is an example only. Image sensor arrays having different features may alternatively be used.

Each of the image sensor cells 110 includes a photodiode, one or more switches configured to selectively receive signals from the row reset and row read buffers connected thereto. In response to the received signals, the switches cooperatively cause each of the image sensor cells 110 to accumulate charge with a storage capacitance according to an amount of light incident thereon, to deliver an image data signal to the one of the ADCs 140 based on the accumulated charge, to initialize the input of one of the ADCs 140, and to initialize the charge storage capacitance.

The ADCs 140 are configured to generate digital words corresponding with the analog voltage at their respective input nodes. Accordingly, the digital words generated by the ADCs correspond with and are a digital representation of the charge accumulated by the image sensor cells 110.

The charge stored in the image sensor cells 110 is a result of accumulated charge conducted by the respective photodiodes, as understood by those of skill in the art, between a time when the charge storage capacitance of image sensor cells 110 are initialized and a time when the image data signal is received by one of the ADCs 140.

The rows of image sensor cells 110 are successively read, and the digital words generated by the ADCs 140 are successively stored in a memory (not shown) to generate image data representing an image sensed by the entire sensor array 100, as understood by those of skill in the art. Furthermore, image data representing multiple images may be successively sensed by the sensor array 100, and stored in the memory.

FIG. 2 is a schematic diagram of an embodiment of an image sensor array cell 200 connected to peripheral circuitry. The image sensor array cell includes photodiode 210, Access transistor 220, reset transistor 230, source follower transistor 240, and ADC transistor 250. The peripheral circuitry includes ADC 260, reset driver 235, TX driver 225, and row select driver 255.

FIG. 3 is a timing diagram illustrating functionality of the image sensor array cell of FIG. 2.

During time T1, the data node of phototransistor 210 is reset. Time T1 may be considered a cell reset time, during which the data node of each of the image sensor array cells in a particular row of an image sensor is reset.

During time T1, reset driver 235 causes the reset node to be high (=rst_hi), and TX driver 225 causes the TX node to be high (=tx_hi). The voltage value of the high voltage at the TX node may, for example, be positive, and greater than a ground voltage. In addition, the row select driver 255 causes the row select node to be low. Because the row select node is low, ADC transistor 250 is not conductive, and the ADC input node is isolated from activity occurring within the image sensor array cell.

During time T1, in response to the reset node being high, reset transistor 230 is conductive. In addition, in response to the TX node being high, the access transistor 220 is conductive. Because the reset transistor 230 is conductive the voltage at node FD is equal to the voltage of the power supply node connected to the drain of reset transistor 230. In addition, because the access transistor 220 is conductive, the voltage at the data node of the phototransistor 210 is also equal to the power supply voltage (Vdd).

At the end of time T1, reset driver 235 causes the reset node to be low, and TX driver 225 causes the TX node to be low. The voltage value of the low voltage at the TX node may, for example, be negative, less than the ground voltage. In response to the reset node being low, reset transistor 230 is nonconductive, and in response to the TX node being low, access transistor is nonconductive. In some embodiments, at the end of time T1, reset driver 235 does not cause the reset node to be low, and reset transistor 230 remains conductive.

Because at least access transistor 220 is nonconductive, the data node of phototransistor 210 is no longer held at the power supply voltage. As understood by those of skill in the art, photodiode 210 conducts charge according to the light it receives. Accordingly, starting with the end of time T1, the voltage at the data node of phototransistor 210 is reduced by photodiode 210 according to the light received by photodiode 210.

During time T2, the ADC input node is reset. Time T2 may be considered an ADC reset or zero or initialization time, during which the ADC input nodes of the image sensor are reset or initialized or zeroed to a starting value as part of or in preparation for a read operation for reading data from the pixels of a particular row of the image sensor.

During time T2, the reset driver 235 causes the reset node to be or to remain high, and the row select driver 255 causes the row select node to be high (=sel_hi). In addition the TX driver 225 causes the TX node to be low. Because the TX node is low, access transistor 220 is not conductive, and the data node of the phototransistor 210 is isolated from activity occurring within the image sensor array cell.

During time T2, in response to the reset node being high, reset transistor 230 is conductive. In addition, in response to the row select node being high, the ADC transistor 250 is also conductive. Because the reset transistor 230 is conductive, the voltage at node FD is equal to the power supply voltage. Because the voltage at node FD is equal to the power supply voltage, source follower transistor 240 is conductive.

Because both source follower transistor 240 and ADC transistor 250 are conductive, source follower transistor 240 and ADC transistor 250 conduct charge from the power supply connected to the drain of source follower transistor 240 to the ADC input node. In response, the voltage at the ADC input node approaches a value equal to the power supply voltage minus a threshold voltage value Vt of source follower transistor 240, as understood by those of skill in the art.

In alternative embodiments, at the end of time T2, the reset driver 235 causes the reset node to become low, and the row select driver 255 causes the row select node to become low. In response to the reset node being low, reset transistor 230 becomes nonconductive. In some embodiments, the resent select node becomes low, and the ADC transistor 250 also becomes nonconductive. In some embodiments, at the end of time T2, row select driver 255 does not cause the row select node to be low, and ADC transistor 250 remains conductive.

In some embodiments, the pixel reset time of a particular row of the image sensor occurs during or near the time the ADC initialization time occurs as part of or in preparation for reading data from the pixels of another row of the image sensor.

During time T3, ADC 260 generates a first digital voltage D0 encoding the voltage at the ADC input node. Accordingly, first digital voltage D0 encodes the value Vdd−Vt.

During time T4, the TX driver 225 causes the voltage at the TX node to become equal to the ground voltage. In alternative embodiments, the TX driver 225 does not change the voltage at the TX node at time T4, such that the voltage at the TX node remains at the voltage value less than the ground voltage.

During time T5, the TX driver 225 causes the voltage at the TX node to become high, and the row select driver 255 either causes the row select node to become high or continues to cause the row select node to be high. In addition, the reset driver 235 causes the voltage at the reset node to remain low, such that the reset transistor 230 remains nonconductive.

In response to the voltage at the TX node becoming high, access transistor 220 becomes conductive. Because access transistor 220 is conductive and reset transistor 230 is nonconductive, the voltage at node FD becomes equal or substantially equal to the voltage (Vdata) at the data node of the phototransistor 210.

In addition, in response to the row select node being high, row select transistor 250 is or becomes conductive. Furthermore, because ADC transistor 250 is conductive, a current sink (not shown) connected to the ADC input node causes the voltages at the ADC input node and the source node of the source follower transistor 240 to drop. In some embodiments, the current sink is part of the ADC 260. In some embodiments, the current sink is not part of the ADC 260, but is connected elsewhere to the ADC input node.

As understood by those of skill in the art, the current sink causes the voltages at the ADC input node and the source node of the source follower transistor 242 drop to an image signal value equal to the voltage at the node FD minus a threshold voltage value Vt of source follower transistor 240.

Accordingly, during time T5, the voltage at the ADC input node becomes equal to Vdata−Vt.

During time T6, the TX driver 225 causes the voltage at the TX node to become equal to the ground voltage, and the row select driver 255 causes the row select node to become low.

In response to the voltage at the TX node becoming the ground voltage, access transistor 220 becomes nonconductive, and the data node becomes isolated from the node FD. In addition, in response to the voltage at the row select node becoming low, the ADC input node becomes isolated from the source follower transistor 240.

During time T7, the TX driver 225 causes the voltage at the TX node to become equal to the low voltage less than the ground voltage.

During time T8, ADC 260 generates a second digital voltage D1 encoding the voltage at the ADC input node. Accordingly, second digital voltage D1 encodes the value Vdata−Vt.

A controller, not shown, may receive both first and second digital voltages D0 and D1, and may determine the image data of the illustrated read operation as a difference between first and second digital voltages D0 and D1.

Figure 4:
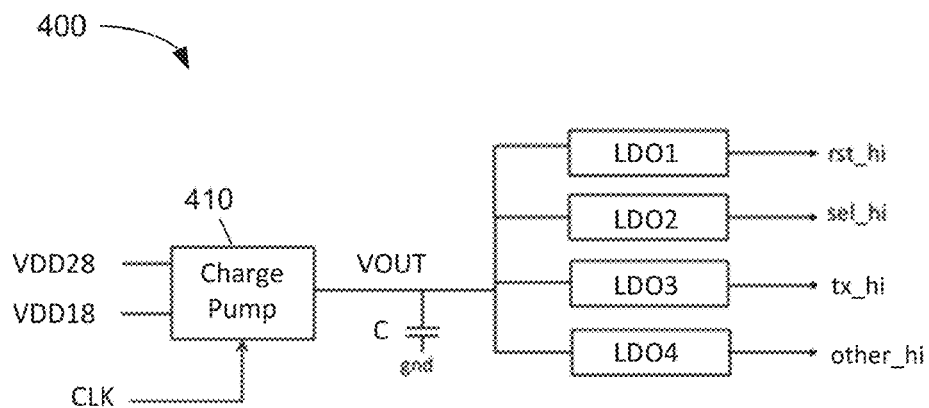
FIG. 4 is a schematic diagram of an embodiment of a charge pump power supply generation system.

FIG. 4 is a schematic diagram of an embodiment of a charge pump power supply voltage generator circuit 400. Power supply voltage generator circuit 400 includes charge pump 410, and low dropout voltage regulators LDO1, LDO2, LDO3, and LDO4. In some embodiments, other types of voltage regulators may be used instead of voltage regulators LDO1, LDO2, LDO3, and LDO4.

In this embodiment, charge pump 410 receives a first input voltage VDD28 having a voltage equal or substantially equal to 2.8 V and receives a second input voltage VDD18 having a voltage equal or substantially equal to 1.8 V. Charge pump 410 also receives a clock signal CLK.

Charge pump 410 generates an output voltage at node VOUT. Based on the first and second input voltages VDD28 and VDD18 and based on the clock signal CLK. In this example embodiment, the output voltage at node VOUT is equal or substantially equal to the sum of the first and second input voltages VDD28 and VDD18. Accordingly, in this example embodiment, the output voltage at node VOUT is equal or substantially equal to 4.6 V.

In alternative embodiments, the first and second input voltages may have different voltages. In some embodiments, a charge pump receives a single input voltage, and generates an output voltage at node VOUT based on the single input voltage. In some embodiments, a charge pump receives a more than two input voltages, and generates an output voltage at node VOUT based on the received input voltages.

The output voltage at node VOUT may have a ripple as a result of the operation of the charge pump circuitry. The ripple may, for example, have periodic voltage excursions which occur at a frequency related to a frequency of the clock signal CLK. For example may occur at the fundamental frequency of the clock signal CLK, the ripple voltage excursions or may occur at twice the fundamental frequency of the clock signal CLK, according to the functionality of the charge pump circuit, as understood by those of skill in the art. The magnitude of the voltage excursions is related to the relative capacitance of one or more charge pump capacitors in the charge pump circuit with respect to the capacitance at node VOUT, as understood by those of skill in the art. Accordingly, the magnitude of the voltage excursions in the output voltage at node VOUT may be reduced by increasing the capacitance of capacitor C.

Capacitor C may be any type of capacitor. For example, capacitor C may have first and second metal plates separated by an insulator. In some embodiments, capacitor C is formed using a transistor using techniques understood by those of skill in the art. For example, capacitor C may be an NMOS transistor having its drain and source connections shorted to a power supply node.

Each of low dropout voltage regulators LDO1, LDO2, LDO3, and LDO4 may generate a different output voltage, for example, based on a received reference voltage, as understood by those of skill in the art.

In the illustrated embodiment, low dropout voltage regulator LDO1 generates an output voltage rst_hi, which is used as a power supply by circuitry described below, low dropout voltage regulator LDO2 generates an output voltage sel_hi, which is used as a power supply by circuitry described below, low dropout voltage regulator LDO3 generates an output voltage tx_hi, which is used as a power supply by circuitry described below, and low dropout voltage regulator LDO1 generates an output voltage other_hi, which may be used as a power supply by other circuitry.

In some embodiments, one or more of the output voltages rst_hi, sel_hi, tx_hi, and other_hi has the same or substantially the same voltage as one or more other of the output voltages rst_hi, sel_hi, tx_hi, and other_hi. In some embodiments, one or more of the output voltages rst_hi, sel_hi, tx_hi, and other_hi has a different voltage as one or more other of the output voltages rst_hi, sel_hi, tx_hi, and other_hi.

The ripple in the output voltage at node VOUT causes a corresponding ripple in each of the output voltages rst_hi, sel_hi, tx_hi, and other_hi. The circuits using output voltages rst_hi, sel_hi, tx_hi, and other_hi as power supplies each require an amount of current from the respective output voltage. The capacitance of the charge pump circuit 410 may be set so that charge pump circuit 410 provides adequate current to node VOUT according to techniques known to those of skill in the art.

In addition, the circuits using output voltages rst_hi, sel_hi, tx_hi, and other_hi as power supplies may each tolerate an amount of power supply ripple. Accordingly, the capacitance of capacitor C may be set according to techniques known to those of skill in the art to reduce the ripple at the output voltage at node VOUT so that the ripple at output voltages rst_hi, sel_hi, tx_hi, and other_hi is less than the tolerance of the circuits using output voltages rst_hi, sel_hi, tx_hi, and other_hi as power supplies.

Figure 5:
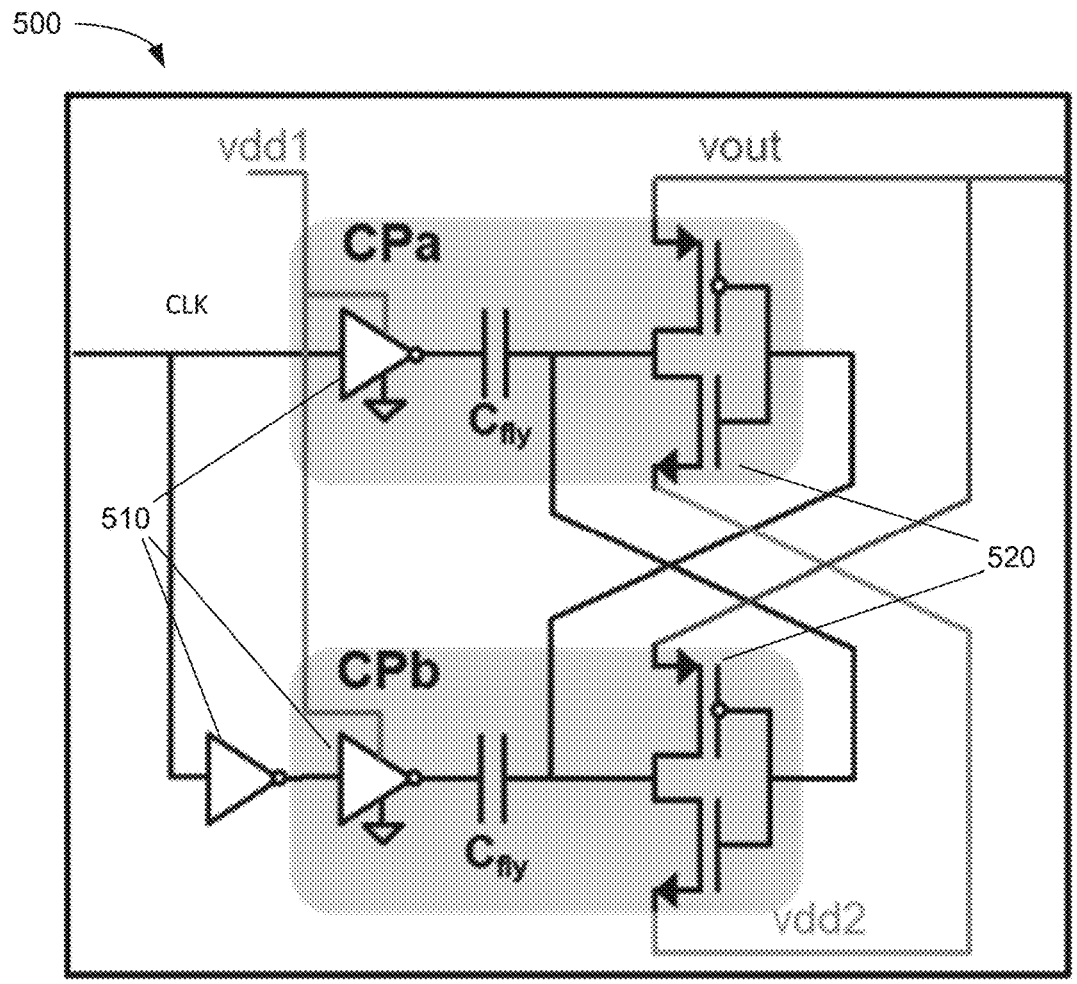
FIG. 5 is a schematic diagram of an embodiment of a charge pump cell.

FIG. 5 is a schematic diagram of an embodiment of a charge pump cell 500, which may be used in charge pump circuit 410. In some embodiments, charge pump circuit 410 uses other charge pump cells.

Charge pump cell 500 includes charge pump CPa and charge pump CPb.

Inverting buffers 510 receive clock signal CLK and generate out of phase clock signals for the capacitors Cfly of charge pumps CPa and CPb, where the voltage swing of the out of phase clock signals is equal to the voltage of the first voltage input vdd1. The out of phase clock signals are respectively coupled by the capacitors Cfly to the inputs of cross coupled inverters 520.

During times when the inputs of the cross coupled inverters 520 are high and greater than the voltage at the second voltage input vdd2 by at least a threshold voltage of the N devices of the cross coupled inverters 520, the outputs of the cross coupled inverters 520 are low and are equal to the voltage of the second voltage input vdd2.

Accordingly, the cross coupled inverters 520 because the low voltages at the outputs of cross coupled inverters to be equal or substantially equal to the voltage of the second voltage input vdd2. In addition, inverting buffers 510 and capacitors Cfly cause the voltage swing at the outputs of cross coupled inverters to be equal or substantially equal to the voltage of the first voltage input vdd1. Therefore, the peak voltage at the outputs of the cross coupled inverters 520 is equal to the sum of the voltages at the first and second voltage inputs vdd1 and vdd2.

Furthermore, while the inputs of cross coupled inverters are low in equal to the voltage of the first voltage input vdd1, the P devices of the cross coupled inverters 520 are conductive, such that charge pump cell 500 causes the voltage at output node vout to be equal or substantially equal to the sum of the voltages at the first and second voltage inputs vdd1 and vdd2 by conducting current thereto.

Figure 6:
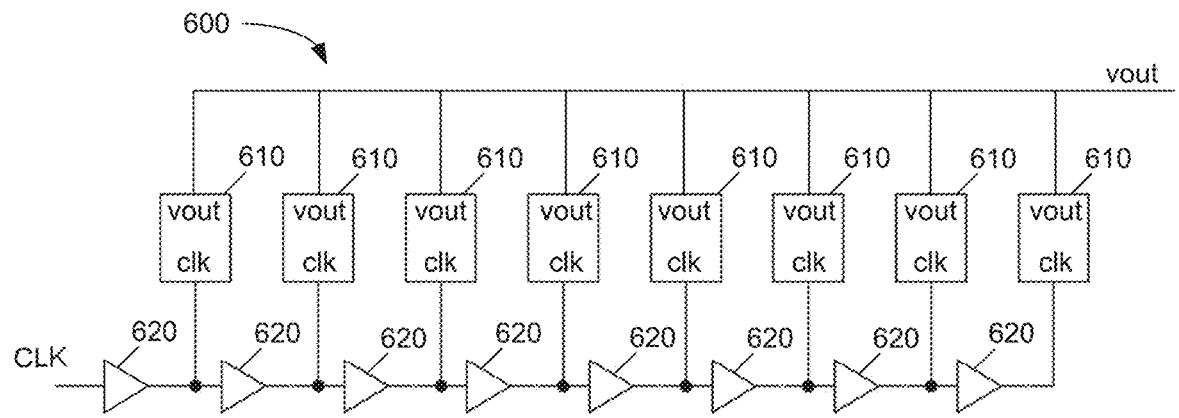
FIG. 6 is a schematic diagram of an embodiment of a delay line charge pump voltage generator circuit using multiple charge pump cells.

FIG. 6 is a schematic diagram of an embodiment of a delay line charge pump voltage generator circuit 600. Delay line charge pump voltage generator circuit 600 may, for example, be used as charge pump circuit 410 of charge pump power supply voltage generator circuit 400. Delay line charge pump voltage generator circuit 600 includes charge pump cells 610 and delay line elements or buffers 620. In some embodiments, delay line buffers 620 are inverting.

In some embodiments, the number of active charge pump cells 610 is controlled, for example, using techniques and principles similar or identical to those discussed in the related application entitled "IMAGE SENSOR WITH CHARGE PUMP CELL QUANTITY CONTROL," filed herewith.

Delay line buffers 620 receive the clock signal at input CLK, and generate clock inputs for each of the charge pump cells 610. In response to the clock inputs, each charge pump cell 610 provides current to output node vout, for example, according to principles similar or identical to those discussed above with reference to charge pump cell 500 and charge pump circuit 410.

Accordingly, each of the charge pump cells 610 conducts current to output node vout to generate a desired output voltage at output node vout based on the received clock signal CLK and received one or more input voltages (not shown). As understood by those of skill in the art, the current sourcing capacity of each of the charge pump cells 610 depends on the capacitance of charge pump capacitors of the charge pump cells 610 and on the ability of the capacitor driving circuits of the charge pump cells 610.

Accordingly, the capacitance of the charge pump capacitors and the ability of the capacitor driving circuits of the charge pump cells 610 are designed so that the charge pump cells 610 collectively provide enough current to output node vout to maintain the desired output voltage at output node vout. Accordingly, each of the charge pump cells 610 is sized so as to provide only a portion current needed to maintain the desired output voltage at output node vout. For example, each of the charge pump cells 610 may be sized so as to provide only 1/N of the current needed to maintain the desired output voltage at output node vout, where N is the number of charge pump cells 610.

As discussed above, the magnitude of the voltage excursions of the ripple caused by each of the charge pump cells 610 in the voltage at output node vout is also dependent on the capacitance of the charge pump capacitors and the ability of the capacitor driving circuits of the charge pump cells 610. Therefore, because each of the charge pump cells 610 is sized so as to provide only a portion of the current needed to maintain the desired output voltage at output node vout, the magnitude of the voltage excursions of the ripple caused by each of the charge pump cells 610 in the voltage at output node vout is proportionally reduced.

For example, if each of the charge pump cells 610 is sized so as to provide only 1/N of the current needed to maintain the desired output voltage at output node vout, the magnitude of the voltage excursions of the ripple caused by each of the charge pump cells 610 in the voltage at output node vout is reduced by a factor of approximately N.

In addition, because a delay of each of the delay line buffers 620, each of the charge pump cells 610 receives a clock input at a different time. Consequently, the voltage excursions of the ripple caused by the charge pump cells 610 is distributed in time across the total delay of delay line buffers 620. Therefore, some of the energy of the ripple caused by charge pump cells 610 occurs at N times the fundamental frequency of the clock signal CLK or at N times half the fundamental frequency of the clock signal CLK. In addition, some of the energy of the ripple caused by charge pump cells 610 occurs at 1 divided by the delay time of each of the delay line buffers 620.

In some embodiments, the delay of each of delay line buffers 620 is controllable or programmable. In some embodiments, the delay of each of delay line buffers 620 is not controllable or is not programmable.

In some embodiments, delay line buffers 620 are sized so that the delay from a particular edge of the clock signal CLK to the corresponding edge in the output of the last delay line buffers 620 caused by the particular edge of the clock signal CLK is less than or equal to one period of the clock signal CLK. In some embodiments, delay line buffers 620 are sized so that the delay is less than one half of one period of the clock signal CLK. In some embodiments, delay line buffers 620 are sized so that the delay is less than one period of the clock signal CLK is less than one or equal to one half of one period of the clock signal CLK across expected variations in manufacturing processing, voltage, and temperature, as understood by those of skill in the art.

Figure 7:
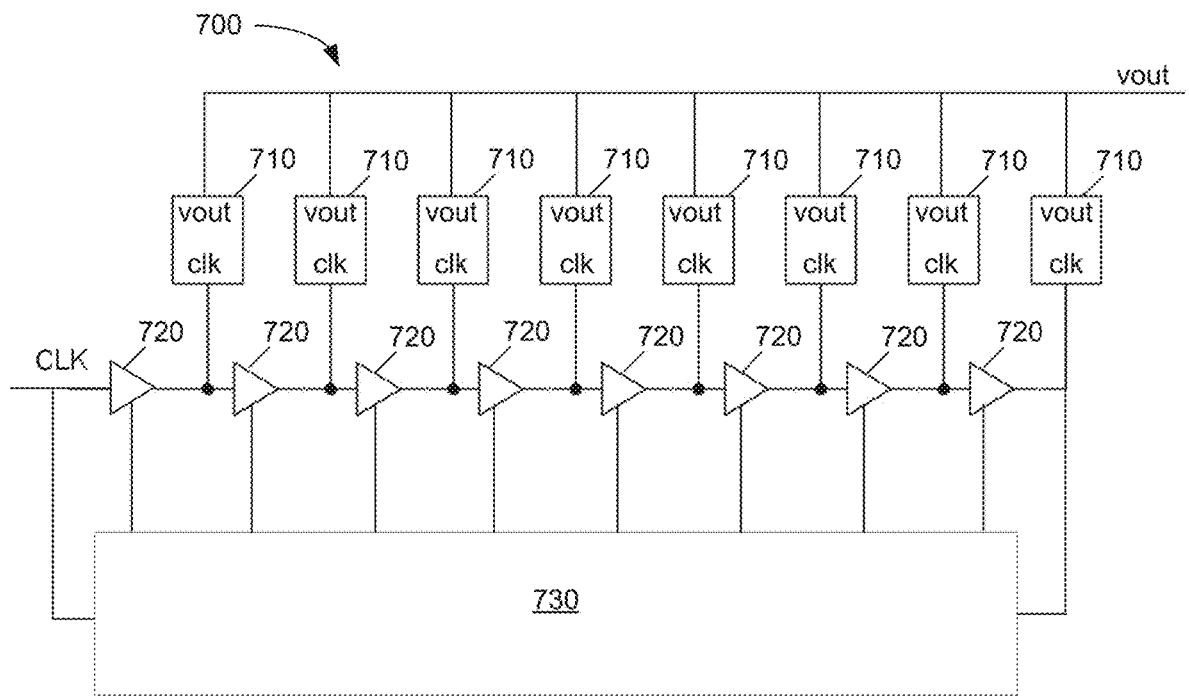
FIG. 7 is a schematic diagram of an embodiment of a calibrated delay line charge pump voltage generator circuit using multiple charge pump cells.

FIG. 7 is a schematic diagram of an embodiment of a delay line charge pump voltage generator circuit 700. Delay line charge pump voltage generator circuit 700 may, for example, be used as charge pump circuit 410 of charge pump power supply voltage generator circuit 400. Delay line charge pump voltage generator circuit 700 includes charge pump cells 710 and delay line elements or buffers 720.

Charge pump cells 710 and their functionality is similar or identical to charge pump cells 610, discussed above. In addition, delay line buffers 720 and their functionality is similar or identical to delay line buffers 620, discussed above. Furthermore, the delay of each of delay line buffers 720 is controllable or programmable. For example, each of delay line buffers 720 may include one or more current starved inverters, and a programmable current source configured to provide a programmable amount of current to the one or more current starved inverters. Other programmable delay buffer circuits may be used.

Delay line charge pump voltage generator circuit 700 also includes delay control circuit 730, which is configured to control the delay of delay line buffers 720. For example, delay control circuit 730 may include a delay-locked loop (DLL) a phase-locked loop (PLL), or another circuit configured to control the delay of each of delay line buffers 720.

Delay control circuit 730 may be configured to control the delay of delay line buffers 720 so that the delay from a particular edge of the clock signal CLK to the corresponding edge in the output of the last delay line buffers 720 caused by the particular edge of the clock signal CLK is less than or equal or substantially equal to one period of the clock signal CLK. In some embodiments, delay control circuit 730 may be configured to control the delay of delay line buffers 720 delay line buffers so that the delay is less than or equal or substantially equal to half of one period of the clock signal CLK.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:
1. An image sensor, comprising:
   a plurality of image sensor cells, each configured to generate an image signal in response to one or more control signals;

a first driver configured to generate a first control signal, wherein the first driver comprises a first positive supply terminal connected to a first power supply node;

a voltage generator configured to generate a first voltage at the first power supply node, wherein the voltage generator comprises:
- a delay line comprising N delay line elements configured to generate N clock signals based on a received clock signal; and
- a plurality of charge pump cells, each configured to receive a respective one of the N clock signals and to source charge to the first power supply node in response to the received one clock signal,
- wherein a delay between the first clock signal and the second clock signal is determined by the delay line, such that a delay between any adjacent first clock signal and second clock signal times N is less than or equal to one period of the received clock signal.

2. The image sensor of claim 1, wherein the second clock signal is generated in response to the first clock signal.

3. The image sensor of claim 1, wherein the first clock signal is generated in response to the received clock signal.

4. The image sensor of claim 1, wherein each of the delay line elements has a non-programmable delay.

5. The image sensor of claim 3, wherein the delay between the first clock signal and the second clock signal times N is less than or equal to one half period of the received clock signal.

6. The image sensor of claim 1, further comprising:
a second driver configured to generate a second control signal, wherein the second driver comprises a second positive supply terminal connected to a second power supply node,
wherein the voltage generator is further configured to generate a second voltage at the second power supply node, and further comprises:
- a first voltage regulator circuit configured to receive a first amount of charge from the charge pump cells, and to provide the received first amount of charge to the first power supply node at the first voltage, and
- a second voltage regulator circuit configured to receive a second amount of charge from the charge pump cells, and to provide the received second amount of charge to the second power supply node at a second voltage.

7. The image sensor of claim 6, wherein the first and second voltages are different.

8. The image sensor of claim 1, wherein the delay between the first clock signal and the second clock signal is controlled by a delay control circuit.

9. The image sensor of claim 8, wherein each of the delay line elements has a programmable delay, and the delay control circuit is configured to control the programmable delay of the delay line elements.

10. A method of using an image sensor, the method comprising:
with each of a plurality of image sensor cells, generating an image signal in response to one or more control signals;

with a first driver, generating a first control signal, wherein the first driver comprises a first positive supply terminal connected to a first power supply node; and with a voltage generator, generating a first voltage at the first power supply node, wherein the voltage generator comprises:
- a delay line comprising N delay line elements configured to generate N clock signals based on a received clock signal; and
- a plurality of charge pump cells, each configured to receive a respective one of the N clock signals and to source charge to the first power supply node in response to the received one clock signal,
- wherein a delay between the first clock signal and the second clock signal is determined by the delay line, such that a delay between any adjacent first clock signal and second clock signal times N is less than or equal to one period of the received clock signal.

11. The method of claim 10, wherein the second clock signal is generated in response to the first clock signal.

12. The method of claim 10, wherein the first clock signal is generated in response to an edge of the received clock signal.

13. The method of claim 10, wherein each of the delay line elements has a non-programmable delay.

14. The method of claim 12, wherein the delay between the first clock signal and the second clock signal times N is less than or equal to one half period of the received clock signal.

15. The method of claim 10, further comprising:
with a second driver, generating a second control signal, wherein the second driver comprises a second positive supply terminal connected to a second power supply node; and
with the voltage generator, generating a second voltage at the second power supply node, wherein the voltage generator further comprises:
- a first voltage regulator circuit configured to receive a first amount of charge from the charge pump cells, and to provide the received first amount of charge to the first power supply node at the first voltage, and
- a second voltage regulator circuit configured to receive a second amount of charge from the charge pump cells, and to provide the received second amount of charge to the second power supply node at a second voltage.

16. The method of claim 15, wherein the first and second voltages are different.

17. The method of claim 10, wherein the delay between the first clock signal and the second clock signal is controlled by a delay control circuit.

18. The method of claim 17, wherein each of the delay line elements has a programmable delay, and the delay control circuit is configured to control the programmable delay of the delay line elements.

* * * * *